US009373680B1

(12) United States Patent
Lee et al.

(10) Patent No.: US 9,373,680 B1
(45) Date of Patent: Jun. 21, 2016

(54) INTEGRATED CIRCUITS WITH CAPACITORS AND METHODS OF PRODUCING THE SAME

(71) Applicant: GLOBALFOUNDRIES Inc., Grand Cayman (KY)

(72) Inventors: Ki Young Lee, Schenectady, NY (US); Tony Joung, Watervliet, NY (US); Sanggil Bae, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/611,908

(22) Filed: Feb. 2, 2015

(51) Int. Cl.
| H01L 21/02 | (2006.01) |
| H01L 49/02 | (2006.01) |
| H01L 23/522 | (2006.01) |
| H01L 21/768 | (2006.01) |
| H01L 21/311 | (2006.01) |
| H01L 23/532 | (2006.01) |
| H01L 27/08 | (2006.01) |

(52) U.S. Cl.
CPC .......... *H01L 28/75* (2013.01); *H01L 21/31144* (2013.01); *H01L 21/76802* (2013.01); *H01L 21/76843* (2013.01); *H01L 21/76877* (2013.01); *H01L 23/5223* (2013.01); *H01L 23/5226* (2013.01); *H01L 23/53238* (2013.01); *H01L 23/53252* (2013.01); *H01L 23/53266* (2013.01); *H01L 28/40* (2013.01); *H01L 27/0805* (2013.01)

(58) Field of Classification Search
CPC ..... H01L 23/5223; H01L 28/40; H01L 28/75; H01L 28/91
See application file for complete search history.

(56) References Cited

U.S. PATENT DOCUMENTS

| 5,576,240 | A | 11/1996 | Radosevich et al. |
| 5,918,135 | A | 6/1999 | Lee et al. |
| 6,166,423 | A | 12/2000 | Gambino et al. |
| 6,284,590 | B1 * | 9/2001 | Cha ......... H01L 28/60 257/E21.008 |
| 6,333,224 | B1 | 12/2001 | Lee |
| 6,461,914 | B1 | 10/2002 | Roberts et al. |
| 6,479,850 | B2 | 11/2002 | Lee |
| 6,649,464 | B2 | 11/2003 | Lee |
| 6,734,489 | B2 * | 5/2004 | Morimoto ......... H01L 21/76807 257/296 |
| 6,853,003 | B2 | 2/2005 | Lee |
| 6,881,999 | B2 | 4/2005 | Lee et al. |
| 7,232,736 | B2 | 6/2007 | Lee |
| 7,239,004 | B2 | 7/2007 | Park et al. |
| 7,344,941 | B2 * | 3/2008 | Kim .................... H01L 23/5223 438/239 |
| 7,439,151 | B2 * | 10/2008 | Coolbaugh ......... H01L 23/5223 257/E21.016 |
| 7,462,535 | B2 | 12/2008 | Lee et al. |
| 7,517,763 | B2 | 4/2009 | Park et al. |
| 8,623,735 | B2 | 1/2014 | Lee et al. |
| 2002/0130388 | A1 * | 9/2002 | Stamper ................. H01L 28/40 257/532 |

* cited by examiner

Primary Examiner — Jesse Y Miyoshi
(74) Attorney, Agent, or Firm — Ditthavong & Steiner, P.C.

(57) ABSTRACT

Integrated circuits with MIM capacitors and methods for producing them with metal and oxide hard masks are provided. Embodiments include disposing a dielectric layer over an ILD, the ILD including a contact therethrough in a first region; forming a capacitor trench in the dielectric layer in a second region; forming a MIM hard mask by: disposing a first metal hard mask in the first region and in the capacitor trench in the second region; disposing an oxide hard mask over the first metal hard mask; and disposing a second metal hard mask over the oxide hard mask; forming a metal line trench through the MIM hard mask in the first region, including over the contact, while masking the second region; and removing portions of the MIM hard mask in the capacitor trench, wherein a remaining portion of the first metal hard mask comprises a bottom plate of an MIM capacitor.

11 Claims, 10 Drawing Sheets

BACKGROUND

INTEGRATED CIRCUITS WITH CAPACITORS AND METHODS OF PRODUCING THE SAME

TECHNICAL FIELD

The technical field generally relates to integrated circuits with capacitors and methods of producing the same, and more particularly relates to integrated circuits with metal/insulator/metal ("MIM") capacitors and methods of producing the same using the hard mask metal layers as MIM capacitor plates.

BACKGROUND

The semiconductor industry is continuously moving toward the fabrication of smaller and more complex microelectronic components with higher performance. Capacitors are used in many integrated circuits for storing data, such as for dynamic random access memory. Capacitors are also used for many analog to digital or digital to analog conversions, as well as many other purposes. MIM capacitors are desirable because they are stable over a range of applied voltages and temperatures. MIM capacitors have metallic bottom and top plates separated by one or more insulator layers.

Transistors and other electronic components are also used in many integrated circuits, and the transistors, capacitors, and other electronic components are interconnected in various ways for different applications. For example, as illustrated in FIG. 1, a MIM capacitor 101 may include metal plates 102 and 103 with an insulating layer 104 therebetween and may be formed in a trench 105 adjacent a conductive structure 106. Vertical contacts are typically formed through insulating layers, and horizontal interconnects are formed within an insulating layer to electrically connect different components. Contacts, interconnects, and capacitors all use conductive materials, and in some instances the same material can be used for two or more of these components. There is a need in the art for more efficient manufacturing methods for the production of electronic components to reduce costs and improve manufacturing rates.

Conventional methods of manufacturing a MIM capacitor, require the deposition of additional materials, e.g. for the metal plates and for the dielectric layer, followed by lithography and etching processes. Existing dual damascene processes, e.g. for forming vias and metal lines, use a metal layer as a hard mask during metal and via patterning processes, and then the metal hard mask is eliminated after processing.

A need therefore exists for methodology enabling manufacture of an accurate and conformal MIM capacitor with a robust cost effective and efficient dual damascene process and the resulting device.

SUMMARY

An aspect of the present disclosure is to efficiently manufacture a MIM capacitor using hard mask metal layers as MIM capacitor plates. Further, a dual damascene metal contact and via can be simultaneously produced with the hard mask metal layers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including disposing a dielectric layer over an interlayer dielectric (ILD), the ILD including a contact therethrough in a first region; forming a capacitor trench in the dielectric layer in a second region; forming a MIM hard mask by: disposing a first metal hard in the first region and in the capacitor trench in the second region; disposing an oxide hard mask over the first metal hard mask; and disposing a second metal hard mask over the oxide hard mask; forming metal line trenches through the MIM hard mask in the first region, including over the contact, while the second region is masked; and removing portions of the MIM hard mask in the capacitor trench, wherein a remaining portion of the first metal hard mask comprises a bottom plate of an MIM capacitor.

Aspects include forming a planarization layer overlying the first and second regions, wherein the planarization layer comprises an organic material. Further aspects include forming a photoresist overlying the planarization layer and the bottom plate. Other aspects include etching the second metal hard mask down to the oxide hard mask of the MIM hard mask in the capacitor trench using the photoresist as a mask. Additional aspects include removing the planarization layer; and depositing a conformal oxide liner over the first and second regions. A further aspect includes disposing a planarization layer overlying the conformal oxide liner in the first and second regions; and forming a hard mask over the planarization layer. Another aspect includes etching through the hard mask and planarization layer to extend the metal line trenches into the dielectric layer and to form a via through a metal line trench down to the contact in the first region. A further aspect includes removing the hard mask and planarization layer; and filling the metal line trenches, via, and capacitor trench with a conductive material and planarizing to an upper surface of the dielectric layer. Other aspects include filling the metal line trenches, via, and capacitor trench by a dual damascene process. Additional aspects include prior to filling the via and capacitor trench with the conductive material, depositing a barrier layer in the via and the capacitor trench. Further aspects include the conductive material comprising copper, tungsten or gold.

Another aspect of the present disclosure is a device including an ILD with a contact formed therethrough in a first region; a dielectric layer over the ILD; a capacitor trench formed through the dielectric layer in a second region adjacent the first region; a MIM capacitor formed in the capacitor trench, the MIM capacitor comprising: a first metal hard mask on a bottom surface of the capacitor trench; an oxide hard mask on the first metal hard mask; a second metal hard mask on the oxide hard mask, the second metal hard mask being smaller than the oxide hard mask; a conformal oxide layer in the capacitor trench and over the MIM capacitor; metal line trenches in the dielectric layer in the first region; a via in the dielectric layer between a metal line trench and the contact; and a metal filling the metal line trenches, the via, and the capacitor trench.

Aspects include the first and second metal hard masks comprise titanium nitride and the oxide hard mask comprises tetraethyl orthosilicate (TEOS). Other aspects include a barrier layer in the metal line trenches, the via, and in the capacitor trench over the conformal oxide layer. Additional aspects include the metal filling the metal line trenches, the via, and the capacitor trench comprises copper, tungsten or gold. Further aspects include an etch stop layer between the ILD and the dielectric layer. Other aspects include the metal filling the metal line trenches, the via, and the capacitor trench is planarized down to an upper surface of the dielectric layer.

Yet another aspect of the present disclosure is a method including forming a capacitor trench in a dielectric layer over an ILD; forming a MIM hard mask overlying the dielectric layer and in the capacitor trench by: depositing a first metal hard mask comprising titanium nitride (TiN); depositing an oxide hard mask comprising TEOS over the first metal hard mask; and depositing a second metal hard mask comprising TiN over the oxide hard mask; forming metal line trenches through the MIM hard mask over the dielectric layer; forming an MIM capacitor at a bottom of the capacitor trench, the MIM capacitor comprising a portion of the first metal hard mask, a portion of the oxide hard mask equal in size to and overlying the first metal hard mask, and a portion of the second metal hard mask smaller than but overlying the oxide hard mask; forming a conformal oxide layer over the MIM hard mask, the metal line trenches, the capacitor trench, and the MIM; extending the metal line trenches into the dielectric layer; forming a via through the dielectric layer through an extended metal line trench overlying a contact formed through the ILD; and filling the metal line trenches, the via, and the capacitor trench with a metal by a dual damascene process.

Aspects include prior to filling the metal line trenches, the via, and the capacitor trench with the conductive material, depositing a barrier layer in the metal line trenches, the via, and the capacitor trench. Other aspects include forming a planarization layer and a hard mask consecutively over the conformal oxide layer prior to extending the metal line trenches; extending the metal line trenches by etching through the hard mask and planarization layer; removing the hard mask and planarization layer after forming the via.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a need for additional metal deposition and patterning attendant upon forming MIM capacitors with other IC components. In accordance with embodiments of the present disclosure, a MIM capacitor and dual damascene metal contact and via are all formed using a multi-layer hard mask with no need for additional metal deposition. In particular, a cost effective MIM capacitor can be made using multiple BEOL hard metal films as capacitor plates. The multi-layer hard mask also helps reduce chamfer during the via etching process due to improved selectivity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
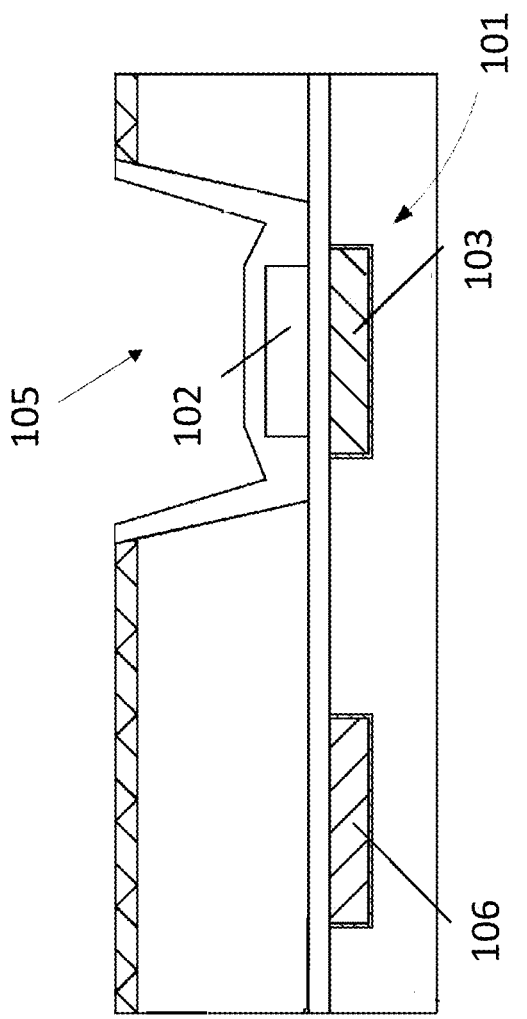
FIG. 1 illustrates a conventional semiconductor device having a capacitor and via contacts.
Figure 2:
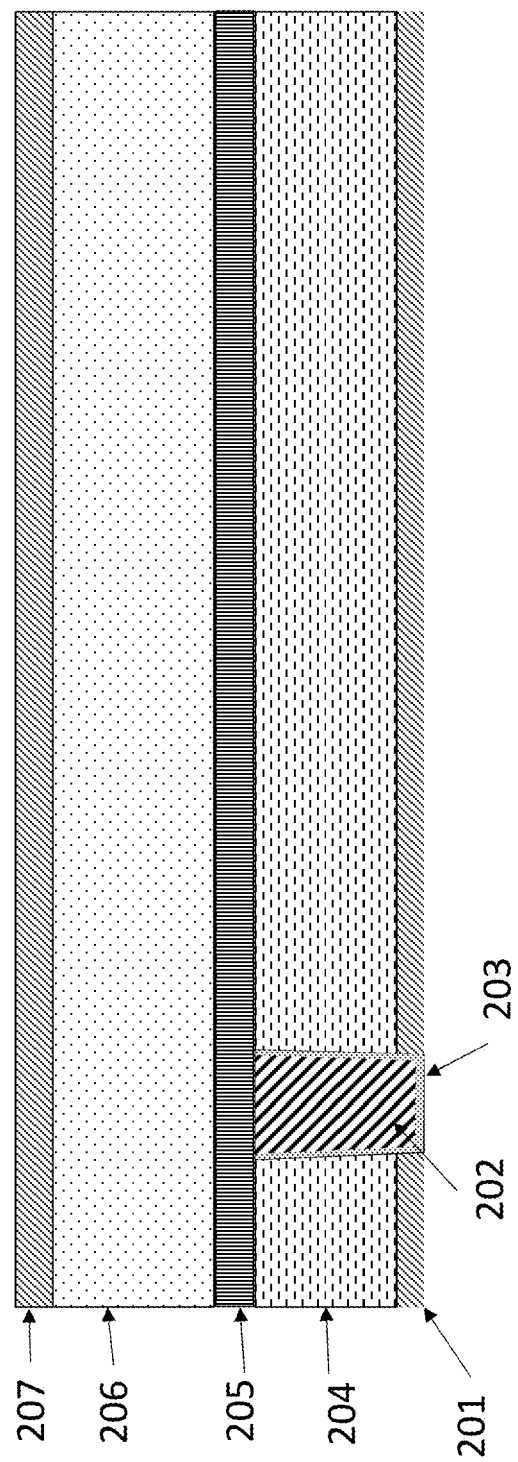
FIGS. 2 through 10 schematically illustrate cross sectional views of a process flow for manufacturing a MIM capacitor in accordance with exemplary embodiments.

FIGS. 2 through 10 schematically illustrate a process flow in accordance with an exemplary embodiment. As illustrated in FIG. 2, an electrical contact 202 overlies an electrical component (not shown for illustrative convenience) on or within a substrate 201. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate 201. The silicon substrate 201 may be a bulk silicon wafer (as illustrated) or may be a thin layer of silicon on an insulating layer (commonly known as silicon-on-insulator or SOI) that, in turn, is supported by a carrier wafer.

The electrical contact 202 is formed in a first region. The contact 202 may be electrically connected to a source, drain, and/or gate of a transistor, or to different electronic components (not shown for illustrative convenience).An ILD 204 overlies the substrate 201, and the electrical contact 202 extends through the ILD 204. As used herein, the term "overlying" means "over" such that an intervening layer may lie between the ILD 204 and the substrate 201, and "on" indicates physically contact between the two elements. The ILD 204 is an insulating material, such as, for example, $SiO_2$, silicon nitride, or the like, and the contact 202 is an electrically conductive material, such as copper, tungsten, or the like and can include a barrier layer 203 surrounding the side and bottom surfaces of the contact 202.

An etch stop layer 205 is formed overlying the ILD 204 and the contact 202. The etch stop layer 205 may be silicon nitride, but other materials can also be used. For example, an etch stop layer with the general formula $SiC_xN_yH_z$ is useful in preventing copper migration, such as is common during annealing. A layer of $SiC_xN_yH_z$ can be deposited at about 1 to 10 Torr of pressure, and a temp of 100 to 400 degrees centigrade (° C.) using 2,2, 5,5,-tetramethyl-2,5-disila-1-azacyclopentane as a precursor. The precursor is a cyclic molecule containing 1 N atom, 2 Si atoms and 2 C atoms in a 5 member ring. Other materials can also be used in the etch stop layer 205.

A dielectric layer 206 is formed overlying the etch stop layer 205. As such, the dielectric layer 206 also overlies the ILD 204, the substrate 201, and other components underlying the etch stop layer 205. The dielectric layer 206 is, for example, silicon dioxide ($SiO_2$), but other electrically insulating materials can also be used. The $SiO_2$ for the dielectric layer 206 may be deposited using octamethylcyclotetrasiloxane (OMCTS) as a precursor, for instance with silane with a plasma provided at about 50 watts (W) to about 3000 W of radio frequency (RF) power at a frequency of about 13.56 MHz and/or 350 KHz. This exposure is followed with an oxygen purge using an oxygen containing gas, such as oxygen gas or nitrous oxide, and a plasma provided at about 50 W to about 3000 W for about 0.1 seconds to about 600 seconds. The OMCTS and purge steps can be repeated until the dielectric layer 206 is at the desired thickness, such as about 50 nanometers (nm) to about 500 nm. Alternatively, the dielectric layer 206 may be deposited by plasma enhanced chemical vapor deposition (PECVD) using dichlorosilane, silane, or tetraethyl orthosilicate (TEOS) as precursors, or other known lower dielectric constant (low-k) $SiO_2$ deposition techniques.

A hard mask layer 207 is optionally formed overlying the dielectric layer 206. The hard mask layer 207 may, for example, be $SiO_2$ formed using ozone and TEOS as precursors in a chemical vapor deposition (CVD) at less than atmospheric pressure, but other materials or other methods of forming $SiO_2$ can also be used. The hard mask layer 207 and the dielectric layer 206 are both electrically insulating materials.

Figure 3:
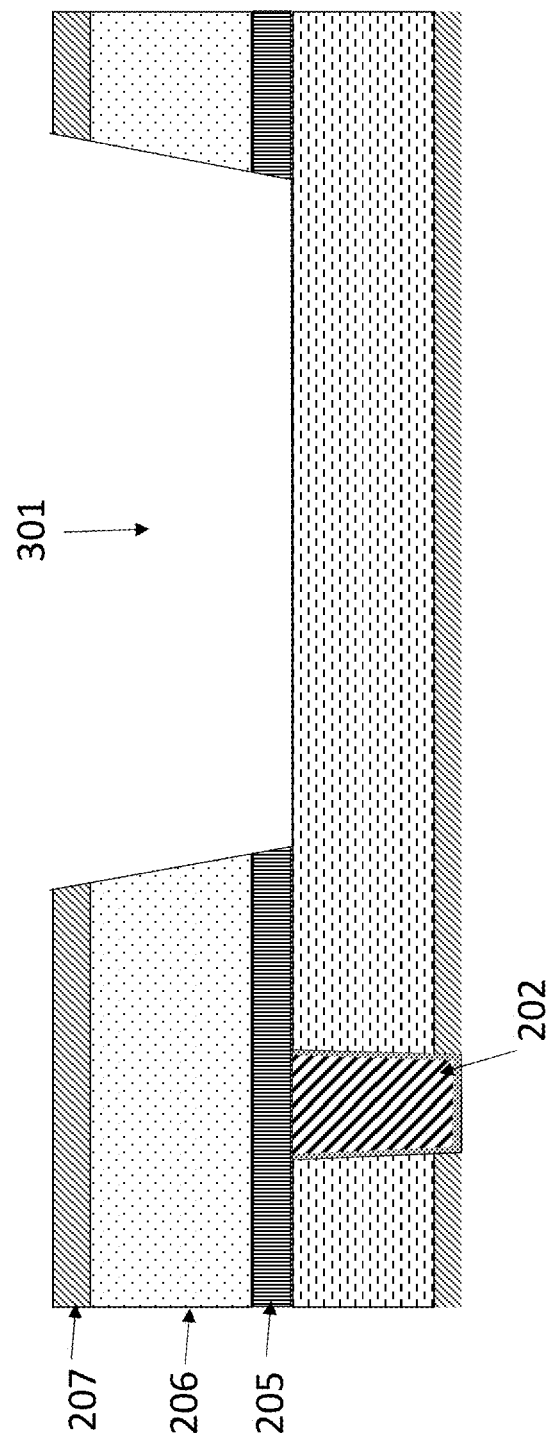

As shown in FIG. 3, a capacitor trench 301 is formed in a second region through the hard mask layer 207, if present, and through the dielectric layer 206 to the etch stop layer 205. A layer of photoresist (not shown for illustrative convenience) may be formed and patterned to expose the hard mask layer 207 for the capacitor trench 301. The capacitor trench 301 is formed using an etchant selective to the material of the dielectric layer 206, and the hard mask layer 207, if present. For example, with a $SiO_2$ dielectric layer 206, the capacitor trench 301 may be formed with a reactive ion etch using carbon tetrafluoride, or a combination of the reactive ion etch with a wet etch using hydrofluoric acid, but many other etchants and etch techniques can alternatively be used. The capacitor trench 301 may stop on top of the etch stop layer 205, or it may extend partially into or fully through the etch stop layer 205 (fully through being illustrated in FIG. 3). The etch stop layer 205 may function as an etch stop during the formation of the capacitor trench 301. The capacitor trench 301 is formed overlying the substrate 201 and the ILD 204, and the capacitor trench 301 is offset from the contact 202 such that capacitor trench 301 is not directly over the contact 202. The capacitor trench 301 may overlie one or more electronic components (not shown for illustrative convenience).

Figure 4:
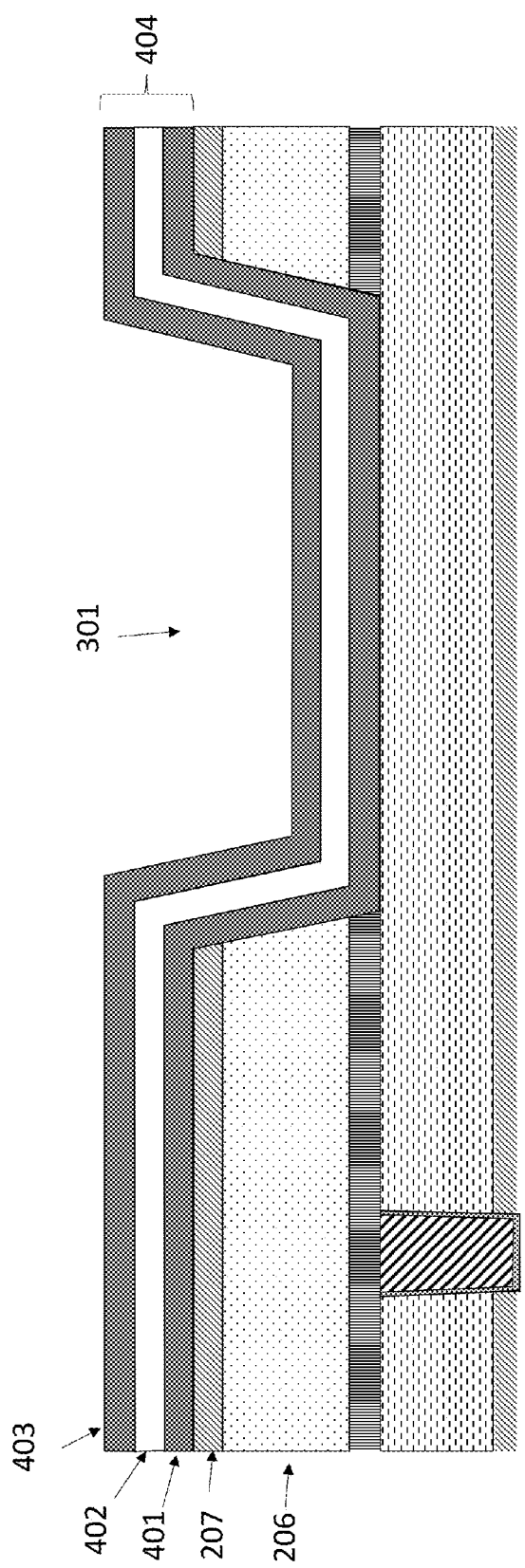

Adverting to FIG. 4, a metal hard mask 401 is formed overlying the dielectric layer 206 and the mask layer 207 (if present), as well as within the capacitor trench 301. The metal hard mask 401 is formed from an electrically conductive metallic material. For example, the first metal hard mask 401 is TiN, but other materials can also be used. TiN can be formed by CVD using tetramethylamidotitanium and nitrogen trifluoride at a pressure of 0.1 to 10 torr and a temperature of about 500° C., but other deposition processes are also possible. The metal hard mask 401 is conformally deposited, as shown in FIG. 4.

As further shown in FIG. 4, an oxide hard mask 402 is formed overlying the metal hard mask 401. The oxide hard mask 402 may be conformally formed from $SiO_2$, which may be deposited using TEOS, as described above. Other insulating materials can alternatively be used for the oxide hard mask 402. The oxide hard mask 402 is formed with a thickness and a dielectric constant to provide the desired capacitor performance for the particular application, as described more fully below. For example, the oxide hard mask 402 may have a thickness of from about 5 nm to about 50 nm.

In FIG. 4, a second metal hard mask 403 is formed overlying the entirety of the oxide hard mask 402, including within the capacitor trench 301. The second metal hard mask 403 is formed from an electrically conductive metallic material, for example TiN, but other materials can also be used. TiN can be formed by CVD using tetramethylamidotitanium and nitrogen trifluoride at a pressure of 0.1 to 10 torr and a temperature of about 500° C., but other deposition processes are also possible. The second metal hard mask 403 is conformally deposited, as shown in FIG. 4. The combination of the metal hard mask 401, oxide hard mask 402, and second metal hard mask 403 form a triple layer MIM hard mask.

Figure 5:
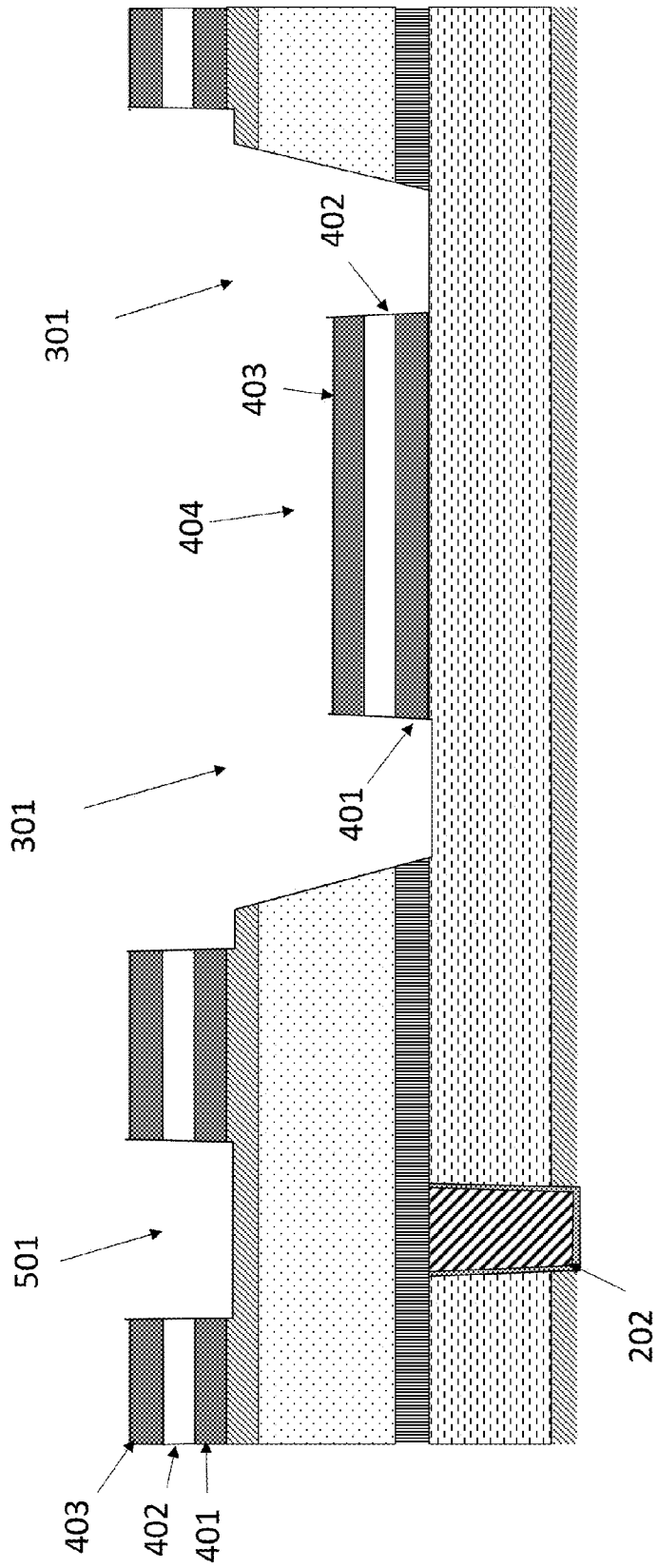

Referring to FIG. 5, the MIM hard mask is etched over the first region where the contact 202 is located thereby forming a metal line trench 501 through the MIM hard mask in the first region overlying the contact 202, while the second region including the capacitor trench 301 is masked (not shown for illustrative convenience). Portions of the MIM hard mask are removed within the capacitor trench 301. Part of the remaining portion of the MIM hard mask 404 in the capacitor trench 301 is shown in FIG. 5. The remaining portion of the first metal hard mask 401 in the capacitor trench 301 will form the bottom plate of the MIM capacitor. The remaining portion of the second metal hard mask 403 in the capacitor trench 301 will form the top plate of the MIM capacitor. The remaining portion of the oxide hard mask 402 in the capacitor trench 301 will form the insulating layer of the MIM capacitor.

Figure 6:
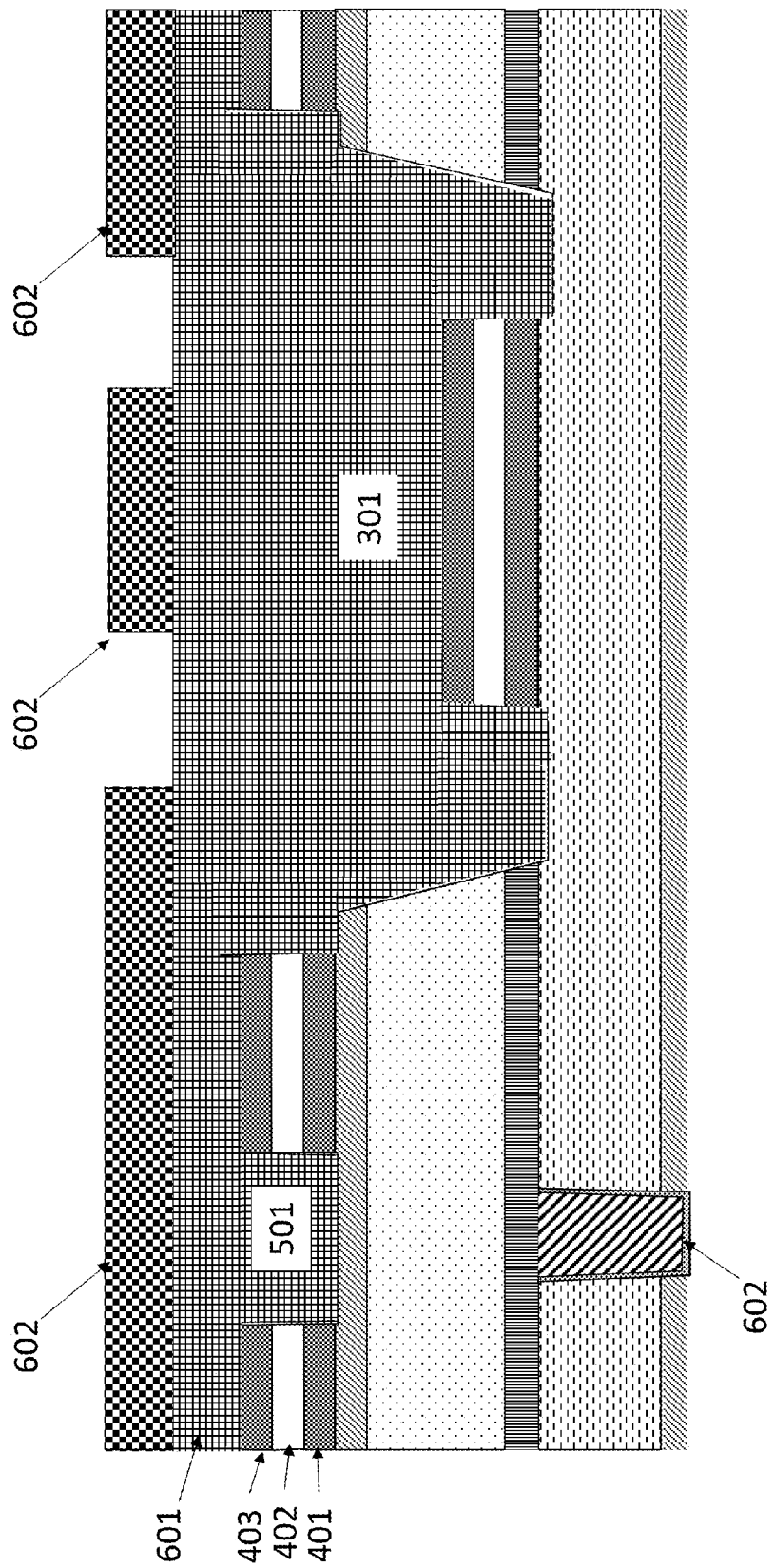

Referring to FIG. 6, a planarization layer 601 is formed overlying the MIM hard mask (formed of the metal hard mask 401, oxide hard mask 402, and second metal hard mask 403) in the first and second regions filling the capacitor trench 301 and metal line 501 overlying the contact 202. The planarization layer 601 forms a relatively smooth top surface. The planarization layer 601 is, for example, a polymer, and may be a photoresist such as DUV photoresist or I-line photoresist, which can be deposited by spin coating. Alternatively, the planarization layer 601 may be an inorganic material, as understood by those skilled in the art. A photoresist 602 is formed and patterned overlying the planarization layer 601. The photoresist 602 is, for example, $SiO_2$ that may be formed by PECVD using silane and nitrous oxide at a temperature of from about 300° C. to about 400° C. The planarization layer 601 provides a smooth, flat upper surface for the photoresist 602, which improves the lithographic accuracy.

Figure 7:
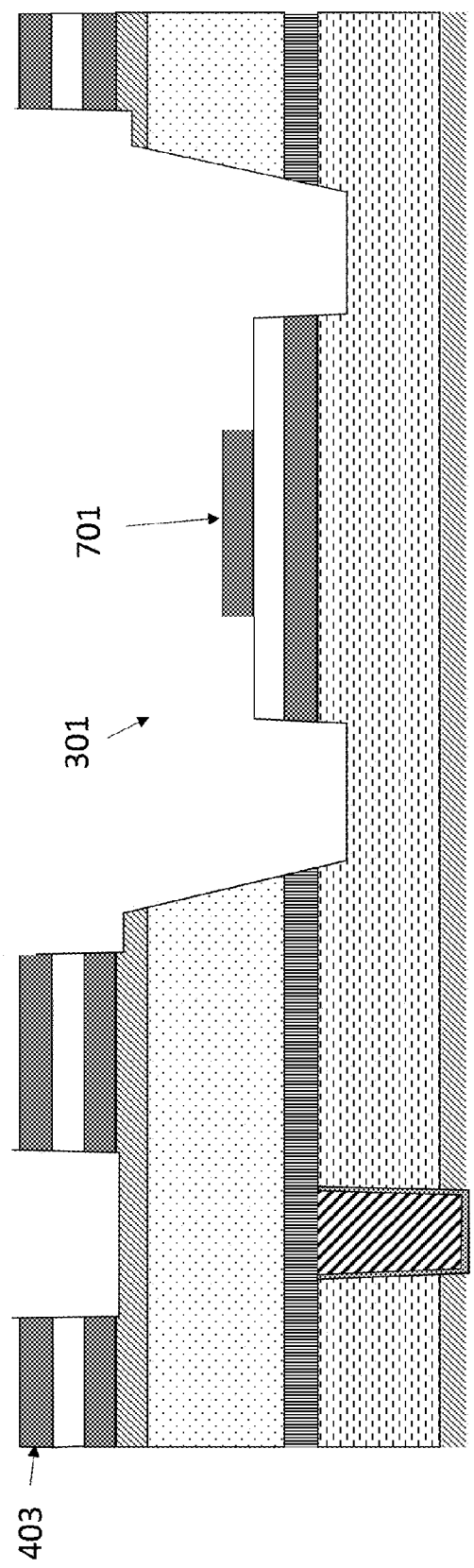

Adverting to FIG. 7, the MIM top plate 701 is formed by way of lithography using the photoresist 602 in FIG. 6. In other words only the portion of the second (upper) metal hard mask 403 in the capacitor trench 301 is etched and only a portion 701 of the second metal hard mask 403 remaining in the capacitor trench 301 is used as the top plate of the MIM capacitor. The second metal hard mask is etched down to the oxide hard mask of the MIM hard mask in the capacitor trench using the photoresist 602 as a mask. The planarization layer 601 is subsequently removed.

Figure 8:
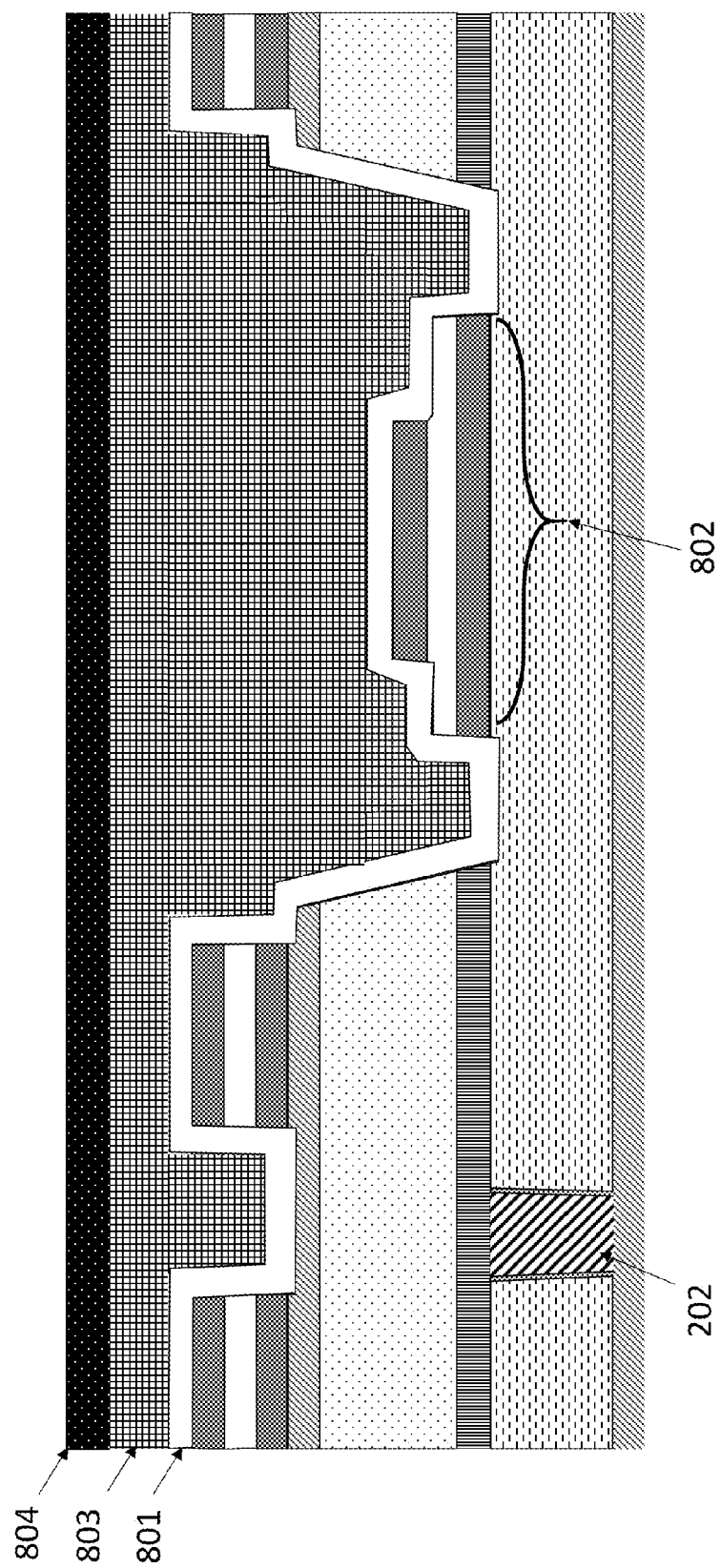

In FIG. 8, a conformal oxide liner 801 is formed over the upper surface to protect the MIM capacitor 802 in the capacitor trench. The conformal oxide layer is deposited to a thickness of 5 nm to 50 nm. A planarization layer 803 is disposed overlying the conformal oxide liner in the first and second regions as shown in FIG. 8. The planarization layer 803 forms a relatively smooth top surface and may be a polymer or a photoresist, such as DUV photoresist or I-line photoresist, which can be deposited by spin coating. Alternatively, the planarization layer 803 may be an inorganic material, as understood by those skilled in the art.

A hard mask 804 is formed over the planarization layer 803. The hard mask layer 804 is $SiO_2$ formed using ozone and TEOS as precursors in a CVD at less than atmospheric pressure, but other materials or other methods of forming $SiO_2$ can also be used. The hard mask 804 is to be used for double patterning a via over the contact 202. As described further below with reference to FIG. 9, an etching step is performed through the hard mask 804 and the planarization layer 803 to extend the metal line trench 501 into the dielectric layer 206 and to form a via through the metal line trench 501 down to the contact 202 in the first region.

Figure 9:
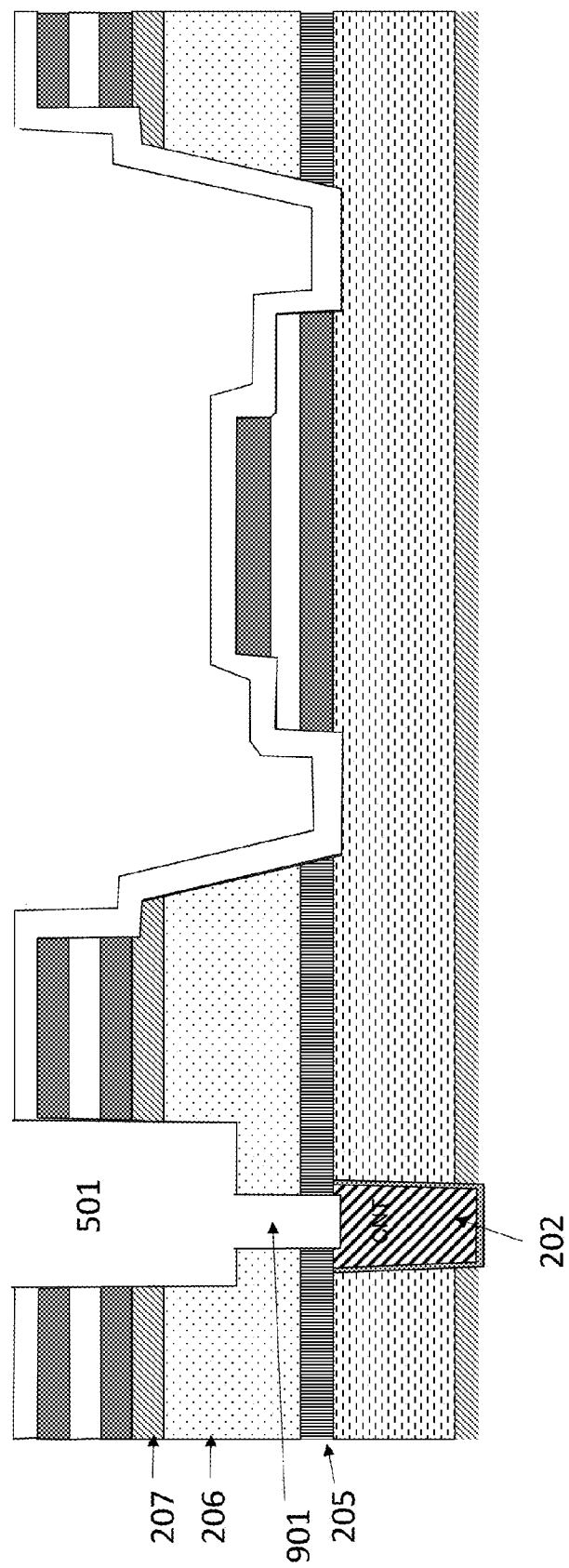

In FIG. 9, an etching step is performed through the hard mask 804 (FIG. 8) and the planarization layer 803 (FIG. 8) to extend the metal line trench 501 through the mask layer 207 into the dielectric layer 206 and to form a via 901 through the metal line trench 501 down through the etch stop layer 205 to the contact 202 in the first region. The via 901 is extended with a reactive ion etch using, for example, carbon tetrafluoride, but other etchants can be used. The hard mask 804 and planarization layer 803 are then removed.

Figure 10:
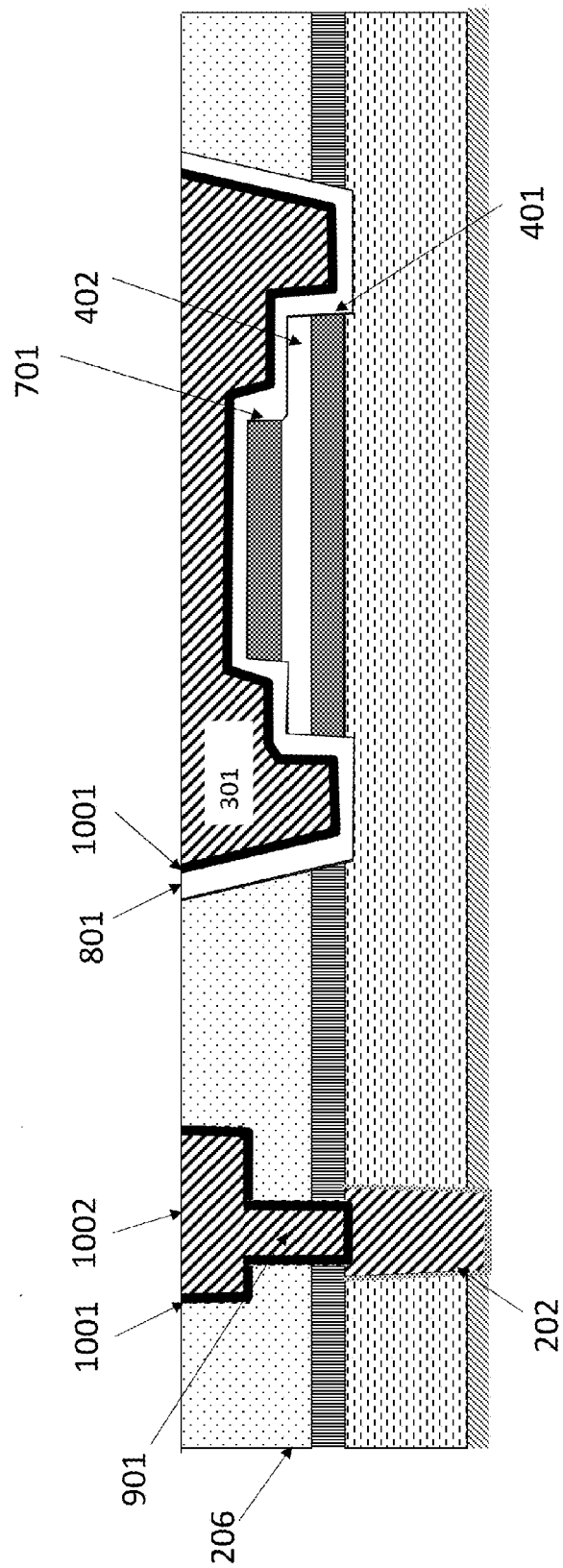

As shown in FIG. 10, the metal line trench 501, via 901 and capacitor trench 301 may next be filled with metal. For example, the metal line trench 501, via 901 and capacitor trench 301 may include copper, but other metals may be used. One technique for filling the metal line trench 501, via 901 and capacitor trench 301 with copper includes the damascene or dual damascene process. In addition, a barrier metal and seed layer 1001 may be formed overlying the exposed surfaces, and then a metal core 1002 may be formed overlying the barrier metal and seed layer 1001. The barrier metal and seed layer 1001 may improve adhesion of the metal core 1002 to dielectric materials and thereby improve reliability. The barrier metal and seed layer 1001 may be formed of copper and manganese deposited by physical vapor deposition (PVD) using copper amidinate and manganese amidinate. Alternatively, the barrier metal and seed layer 1001 may be formed from titanium, titanium nitride, or other materials. The core 1002 may then be deposited, such as by electroplating. The metal core may be about 90 mass percent or more copper, and various copper alloys can be used, some of which include less than 90 mass percent copper. The metal line trench 501 and via 901 once filled form an electric connection with the contact 202. The simultaneous filling of the metal line trench 501, via 901 and capacitor trench 301 reduces the number of manufacturing steps over processes that form these components separately. Alternatively, the metal filling the capacitor trench 301 can be a metal different from that used in the metal line trench 501 and via 901, which, for example, can be filled with copper while the capacitor trench 301 can be filled by tungsten or gold.

In filling the metal line trench, via, and capacitor trench, an overburden is generally formed. The overburden and excess material is removed, such as by chemical mechanical planarization (CMP), as illustrated in FIG. 10. Thus, the upper surface of the capacitor trench 301 becomes substantially planar with an upper surface of the dielectric layer 206 following the planarization step.

The MIM capacitor in FIG. 10 includes a top plate 701, bottom plate 401 and oxide layer 402 disposed in between. The oxide liner 801 and barrier metal and seed layer 1001 are formed over the MIM capacitor.

The embodiments of the present disclosure can achieve several technical effects, such as formation of a MIM capacitor using hard mask metal layers as MIM capacitor plates thereby utilizing material normally disposed of and eliminating the need for deposition of additional material. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    disposing a dielectric layer over an interlayer dielectric (ILD), the ILD including a contact therethrough in a first region;
    forming a capacitor trench in the dielectric layer in a second region;
    forming a metal-oxide-metal ("MIM") hard mask by:
        disposing a first metal hard mask in the first region and in the capacitor trench in the second region;
        disposing an oxide hard mask over the first metal hard mask; and
        disposing a second metal hard mask over the oxide hard mask;
    forming a metal line trench through the MIM hard mask in the first region, including over the contact, while the second region is masked;
    removing portions of the MIM hard mask in the capacitor trench to expose a portion of the ILD, wherein a remaining portion of the first metal hard mask comprises a bottom plate of an MIM capacitor;
    forming a planarization layer overlying the first and second regions, wherein the planarization layer comprises an organic material;
    forming a photoresist overlying the planarization layer and the bottom plate; and
    etching the second metal hard mask down to the oxide hard mask of the MIM hard mask in the capacitor trench using the photoresist as a mask.

2. The method according to claim 1, further comprising:
    removing the planarization layer; and
    depositing a conformal oxide liner over the first and second regions.

3. The method according to claim 2, further comprising:
    disposing a second planarization layer overlying the conformal oxide liner in the first and second regions; and
    forming a hard mask over the second planarization layer.

4. The method according to claim 3 further comprising:
    etching through the hard mask and second planarization layer to extend the metal line trench into the dielectric layer and to form a via through the metal line trench down to the contact in the first region.

5. The method according to claim 4 further comprising:
removing the hard mask and second planarization layer;
filling the metal line trench, via, and capacitor trench with a conductive material; and
planarizing to an upper surface of the dielectric layer.

6. The method according to claim 5 comprising:
filling the metal line trenches, via, and capacitor trench by a dual damascene process.

7. The method according to claim 5, further comprising:
prior to filling the via and capacitor trench with the conductive material, depositing a barrier layer in the via and the capacitor trench.

8. The method according to claim 7, wherein:
the conductive material comprises copper, tungsten or gold.

9. A method comprising:
forming a capacitor trench in a dielectric layer over an interlayer dielectric (ILD);
forming a metal-oxide-metal (MIM) hard mask overlying the dielectric layer and in the capacitor trench by:
   depositing a first metal hard mask comprising titanium nitride (TiN);
   depositing an oxide hard mask comprising tetraethyl orthosilicate (TEOS) over the first metal hard mask; and
   depositing a second metal hard mask comprising TiN over the oxide hard mask;
forming metal line trenches through the MIM hard mask over the dielectric layer;
forming an MIM capacitor at a bottom of the capacitor trench, the MIM capacitor comprising a portion of the first metal hard mask, which comprises a bottom plate of the MIM capacitor, a portion of the oxide hard mask equal in size to and overlying the first metal hard mask, wherein a portion of the bottom of the capacitor trench is not covered by the MIM capacitor;
forming a photoresist overlying a planarization layer and the bottom plate;
etching the second metal hard mask down to the oxide hard mask of the MIM hard mask in the capacitor trench using the photoresist as a mask, wherein a portion of the second metal hard mask is smaller than but overlying the oxide hard mask;
forming a conformal oxide layer over the MIM hard mask, the metal line trenches, the capacitor trench, and the MIM capacitor;
forming a second planarization layer and a hard mask consecutively over the conformal oxide layer prior to extending the metal line trenches;
extending the metal line trenches into the dielectric layer;
forming a via through the dielectric layer through an extended metal line trench overlying a contact formed through the ILD; and
filling the metal line trenches, the via, and the capacitor trench with a metal by a dual damascene process.

10. The method according to claim 9, further comprising:
prior to filling the metal line trenches, the via, and the capacitor trench with the conductive material, depositing a barrier layer in the metal line trenches, the via, and the capacitor trench.

11. The method according to claim 9, further comprising:
extending the metal line trenches by etching through the hard mask and second planarization layer; and
removing the hard mask and second planarization layer after forming the via.

* * * * *